United States Patent [19]

De Lisle

[11] 3,863,320

[45] Feb. 4, 1975

[54] SUBSTRATE LOADER

[75] Inventor: Robert W. De Lisle, Dover, Pa.

[73] Assignee: E. I. du Pont de Nemours and Company, Wilmington, Del.

[22] Filed: Aug. 15, 1973

[21] Appl. No.: 388,363

[52] U.S. Cl. .............................................. 29/203 B
[51] Int. Cl. .......................................... H05k 13/04
[58] Field of Search...... 29/203 B, 203 DS, 203 DT, 29/203 D, 203 R

[56] References Cited

UNITED STATES PATENTS

| | | | |
|---|---|---|---|
| 2,896,213 | 7/1959 | Alderman et al. | 29/203 B |
| 2,907,040 | 10/1959 | Woods | 29/203 B |
| 2,908,010 | 10/1959 | Lord et al. | 29/203 B |
| 3,496,626 | 2/1970 | Ullman et al. | 29/203 DS |

*Primary Examiner*—Thomas H. Eager
*Attorney, Agent, or Firm*—Thomas Hooker

[57] ABSTRACT

Apparatus for automatically loading ceramic substrates of the type carrying integrated electronic circuits on clip-type terminals. Terminal strip feed means indexes a number of clip-type terminals to a loading zone and ceramic substrate feed means positions a ceramic substrate adjacent the terminals. A pusher moves the substrate laterally to engage one edge of the substrate with the clip-type terminals so that each terminal is in physical contact with a metallic contact pad on the edge of the substrate. Subsequently, solder connections between the terminals and tabs may be formed.

7 Claims, 12 Drawing Figures

SUBSTRATE LOADER

The invention relates to apparatus for mounting ceramic substrates to clip-type terminals, and particularly to a machine for sequentially indexing a number of clip-type terminals on a carrier strip to a loading zone and loading a ceramic substrate on the terminals. The invention includes terminal strip feed path, a sequentially operable feed mechanicism for positioning a group of clip-type terminals on a carrier strip in a loading zone, a continuous belt for moving ceramic substrates from one side of the feed path beneath the feed path and to a first position adjacent and below the loading zone, an elevator for raising individual ceramic substrates from the first position to a second position immediately adjacent the loading zone, and a pusher for moving the ceramic substrates from the second position in a direction opposite to the direction of movement of the substrates by the belt toward the clip-type terminals in the loading zone so that one edge of the caramic substrate is loaded onto the terminals with each terminal engaging a metallic contact-pad on the ceramic substrate. Subsequently, the terminals may be soldered to the individual pads so that an electrical connection is formed between the terminals and the integrated electronic circuits on the ceramic substrate. The terminals conventionally include tail portions adapted to be soldered to circuit boards.

Heretofore, solder terminals for establishing electrical connections between ceramic substrates and circuit boards or the like were manually attached to the substrates and soldered in position. The apparatus of the present invention represents a marked improvement over this technique whereby the ceramic substrates are automatically fed from a supply source and individually loaded onto clip-type terminals on a carrier strip.

If desired, the terminals with the substrates loaded onto them may be left attached to a continuous carrier strip for reeling or passing through a continuous solder operation for forming the desired solder connections between the terminals and the contact pads on the substrates. Alternatively, each loaded substrate, or groups of loaded substrates, may be severed from the remainder of the terminal carrier strip so that terminals on the loaded substrate or group of loaded substrates are held in place by the severed portion of the carrier strip. Subsequent to soldering, the carrier strip may be removed from the terminals since the soldered connections between the terminals and the pads hold the terminals to the substrates in the desired position.

The apparatus includes a cutter for removing selective terminals from the carrier strip prior to loading of substrates to the terminals. The terminals are located on the carrier strip at regularly spaced intervals. While many ceramic substrates have contact pads at regularly spaced intervals along one edge thereof equal to the spacing of the terminals on the carrier strip and require that an individual terminal be attached at each contact pad, other ceramic substrates do not have contact pads at each location along an edge thereof corresponding to the terminal positions on the carrier strip. The programable blanking means automatically removes terminals from the carrier strip at the locations where it is not desired that a terminal be attached to the ceramic substrate. The blanking means includes a number of knives and drive means for actuating the knives so that the cutting edges on the knives sever undesired terminals from the carrier strip, and in that way assure that terminaly are attached to the edge of the ceramic substrate only where desired.

Other objects and features of the invention will become apparent as the description proceeds, especially when taken in conjunction with the accompanying drawings illustrating the invention, of which there are five sheets.

Figure 1:
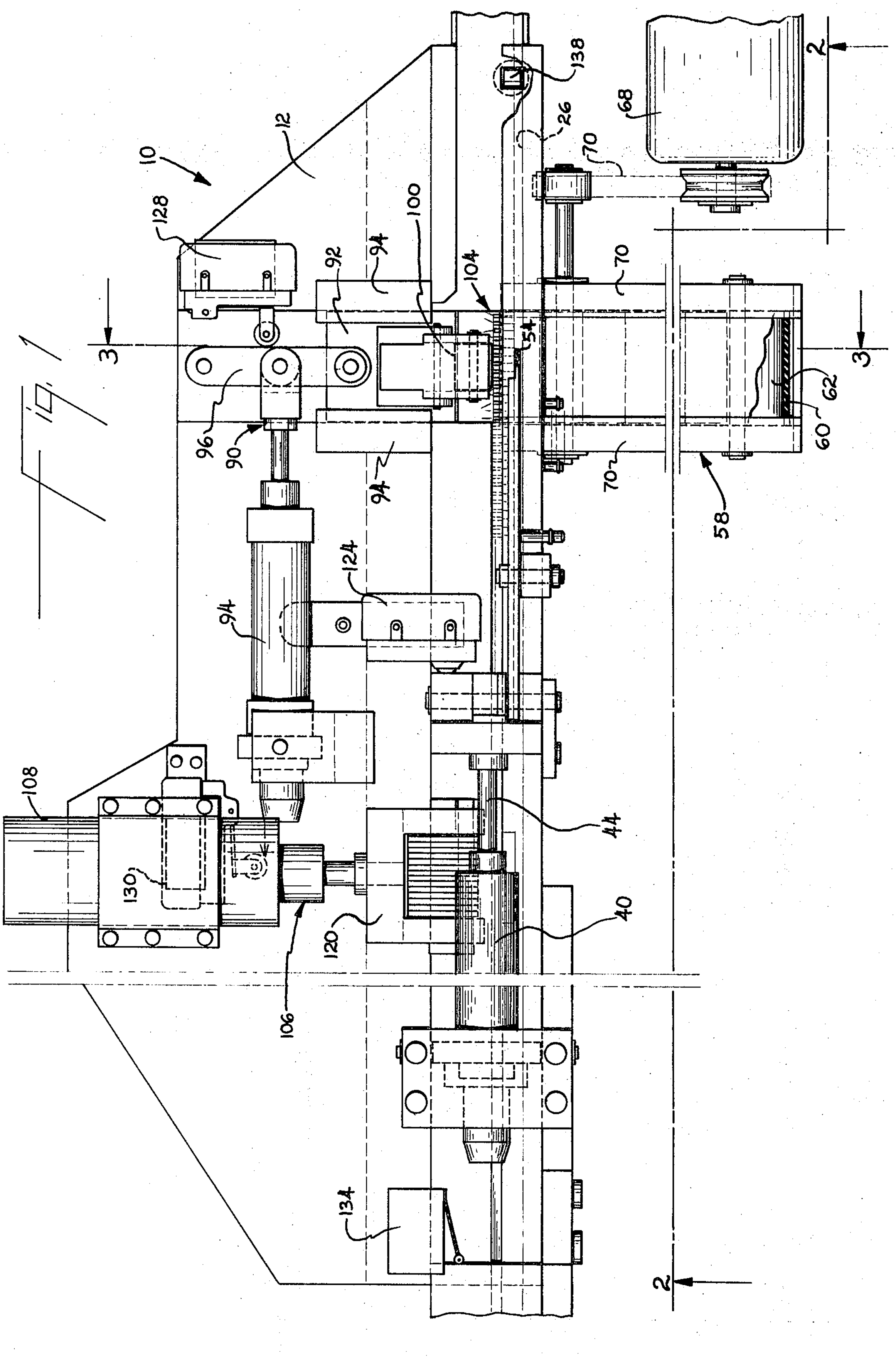
FIG. 1 is a plan view of a substrate loader according to the invention.

Substrate loader 10 includes a flat plate 12 supported by vertical plate 14 secured to base plate 16. Plate 16 may be secured to a suitable base 18. Elongate bar 22 extends along one edge of plate 12 and cooperates with cover plate 24 mounted on the top thereof to define a terminal strip feed path 26 extending along the edge of the plate 12. A terminal strip 28 of the type illustrated in FIGS. 6 through 9 is confined in the feed path 26. Strip 28 includes a continuous carrier strip 30 and a number of regularly spaced clip-type terminals 32 which extend outwardly from cover plate 24 away from the adjacent edge of plate 12 to expose substrate receiving clip portions 34. The carrier strip includes regularly spaced pilot holes 36.

Strip feed mechanicism 38 includes a feed air cylinder 40 secured to bar 22 by support 42 and having a piston rod 44 engagable with the feed finger 46 through a pivot connection 48. Link 50 secures the pivot end of the feed finger to plate 12. The tip 52 of the feed finger extends through a slot 54 in cover plate 24 and extends into a pilot hole 36 of carrier strip 30. Spring 54 biases end 52 against the strip. A conventional anti-backup pawl 56 prevents retrograde movement of the terminal strip 28 during retraction of the feed finger 46.

Figure 3:
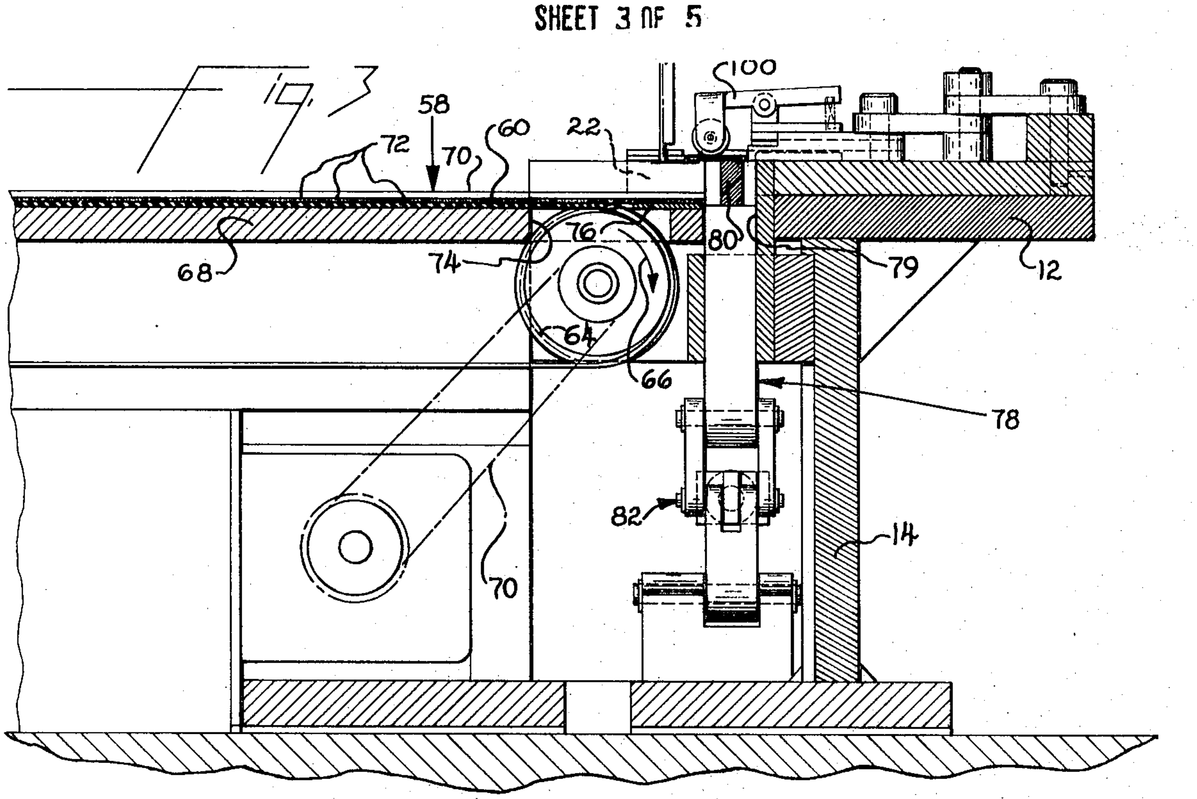
FIGS. 3 and 4 are sectional views taken generally along line 3—3 of FIG. 1, but illustrating different steps in the cycle of operation.
Figures 4, 5:
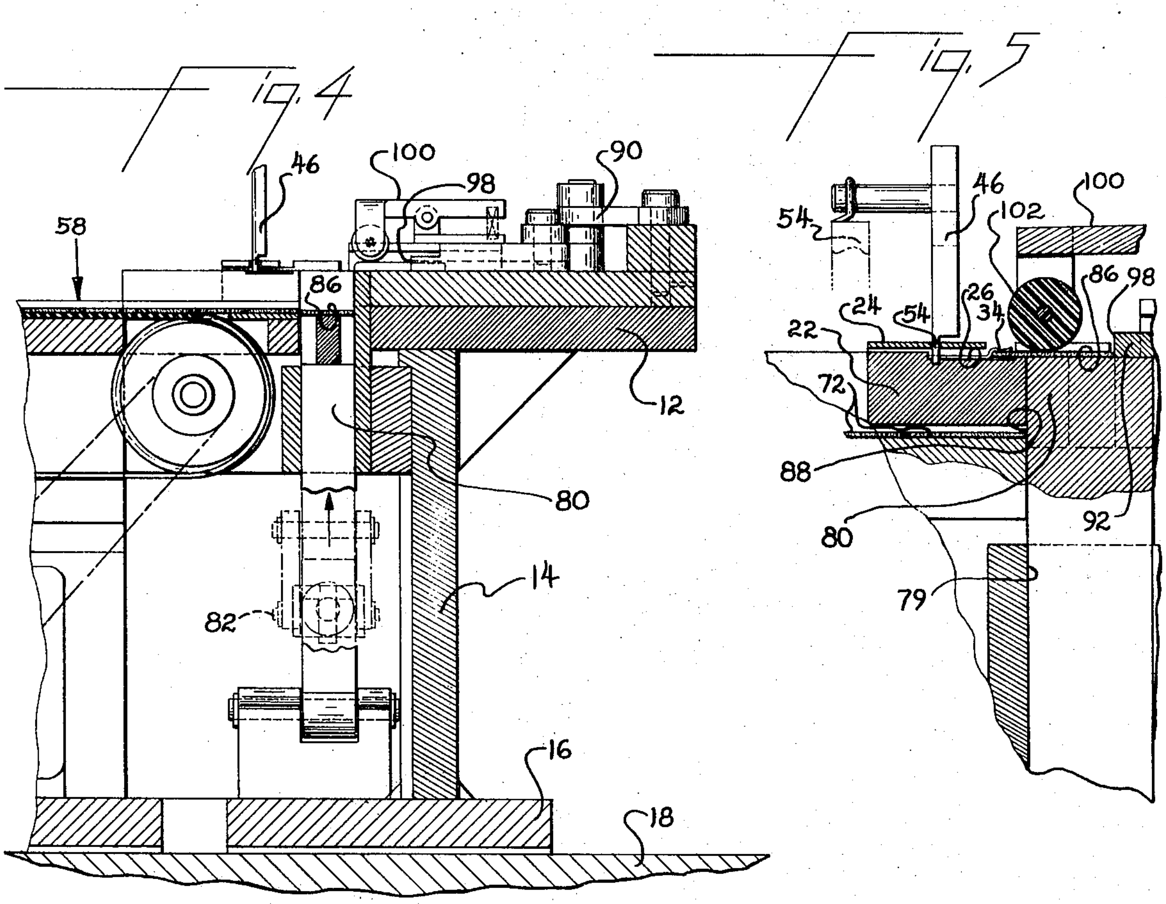
FIG. 5 is an enlargement of a portion of FIG. 3.

Substrate feed mechanism 58 is mounted on plates 12, 14, and 16 adjacent the front edge of plate 12 as illustrated in FIGS. 4 and 5 and includes a continuous substrate feed belt 60 extending between a pair of cylindrical rollers 62 and 64. Roller 64 is rotated in a clockwise direction as indicated by arrow 66 in FIG. 3 by motor 68 and belt drive 70. The belt 60 is continuously moved around the rollers with the upper feed run of the belt moving toward the plate 12. The substrate feed mechanicism 58 includes a support surface 68 beneath the upper run of the belt and a pair of guides 70 to either side of the belt. The interior faces of the guides extend over the belt and are spaced a distance above the belt sufficient to allow flat rectangular ceramic substrates 72 to be carried by the belt from a loading station adjacent roller 62 toward plate 12. The upper portion of roller 64 extends into cutout 74 in plate 68. The substrates carried by belt 60 are fed from the belt and onto a thin support plate 76.

Substrate elevator mechanism 78 includes a substrate elevator 80 confined in recess 79, elevator drive toggle linkage 82 and an elevator air cylinder 84 extendable to extend linkage 82 and raise the elevator from the retracted position of FIG. 4 where the upper or substrate-receiving surface 86 thereof forms an extension of the upper surface of plate 76 to the elevated position of FIG. 3 where surface 86 is flush with the adjacent surface of bar 22, as illustrated best in FIGS. 4 and 5. The upper run of belt 60 moves continuously toward the elevator 80 and pushes the lead substrate onto the top of the elevator, when retracted, as illustrated in FIG. 4. When elevator 84 is raised, the next upstream substrate is held against edge 88 of the elevator, illustrated in FIG. 5.

Figures 6, 7, 8, 9:
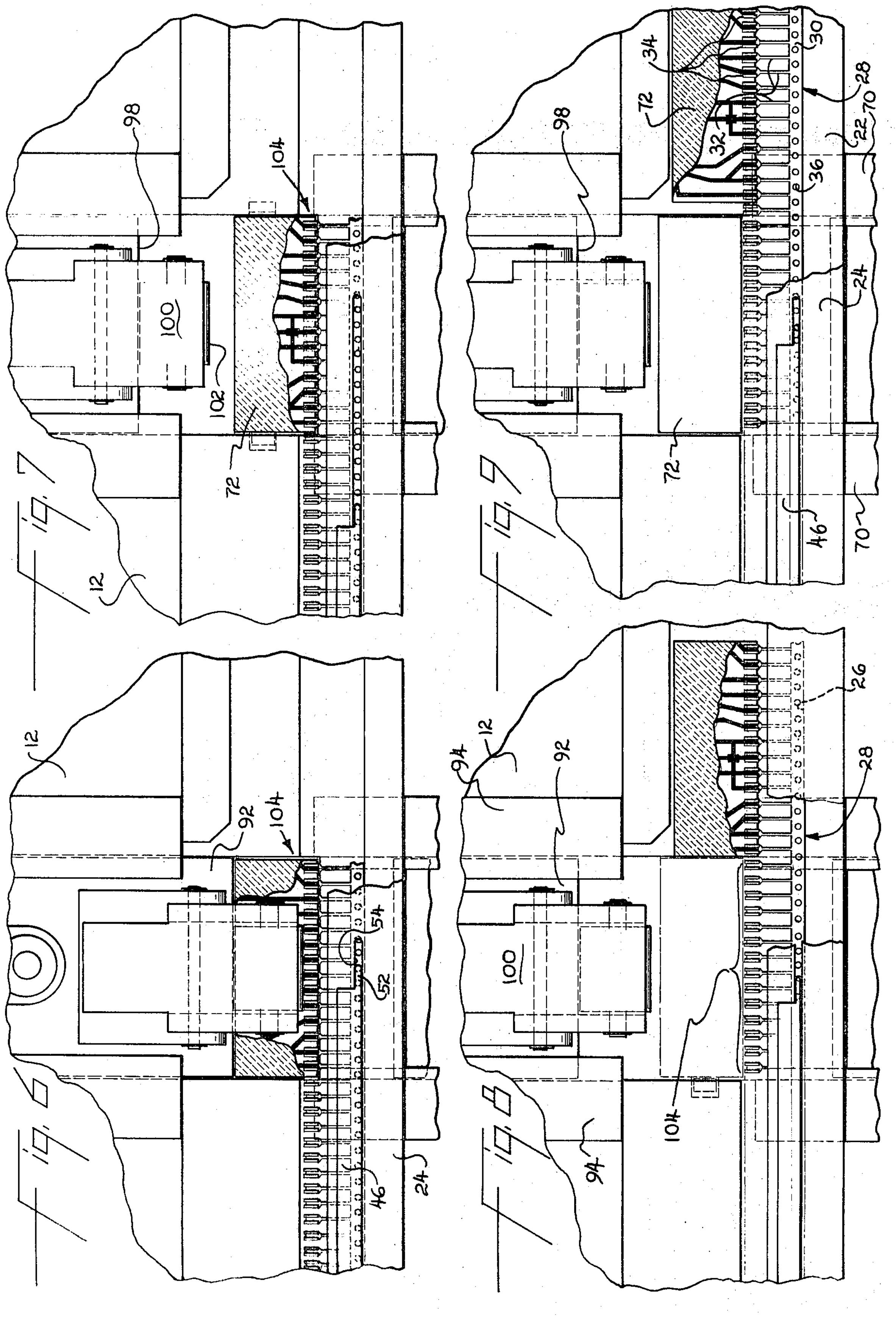
FIGS. 6 through 9 are partial plan views of the substrate loader illustrating the operation thereof.

Substrate pushing mechanism 90 mounted on plate 12 includes a pusher slide plate 92 confined on plate 12 by gibbs 94 for movement toward and away from the terminals on the carrier strip adjacent elevator 80, air cylinder 94, and a toggle linkage 96 driven by the air cylinder so that upon extension of the air cylinder the linkage is extended to move the slide from the position of FIG. 8 to the position of FIGS. 5 and 6. Retraction of the air cylinder collapses the linkage 96 to retract the slide 92. The slide includes a substrate pushing surface 98 on the front edge thereof. This surface is normally retracted away from the elevator 80, as illustrated in FIG. 4. Extension of the toggle linkage moves surface 98 toward the terminal strip so that it picks up the elevated substrate and forces it into engagement with the exposed terminal clip portions 34.

A substrate clamp 100 is mounted on the top of slide 92 and includes a resilient roller 102 which is spring biased so that upon movement of the slide toward the terminals, the roller 102 first engages the elevated substrate and holds it flat against the surface of the elevator to assure that it is properly picked up and pushed forward by surface 98. See FIG. 5.

Each cycle of operation of the feed mechanicism 38 moves a number of terminals 32 to the loading or work zone 104 adjacent the elevator. The terminals are secured to strip 30 at regular intervals. Loader 10 normally loads all of the regularly spaced terminals 32 in the loading zone on one edge of a substrate 72. Some substrates do not require the maximum number of terminals available at the loading zone. A selectively actuable blanking mechanism is provided to remove unneeded terminals from strip 28.

Terminal blanking mechanism 106 is located adjacent the feed path upstream from the loading zone 104 a distance equal to an integral number of feed strokes. The blanking device 106 includes an air cylinder 108 and a number of terminal blanking knives 110 illustrated best in FIGS. 10 and 11. The knives 110 are pivotally mounted to plate 12 on pin 112. The thickness of each knife is equal to the lead distance of each terminal 32 on strip 28. The knives each include a terminal cutting edge 114 and a pin-receiving cutout 116. Pin 118 extends between the arms of yoke 120 on the piston rod of air cylinder 108.

Figure 10:
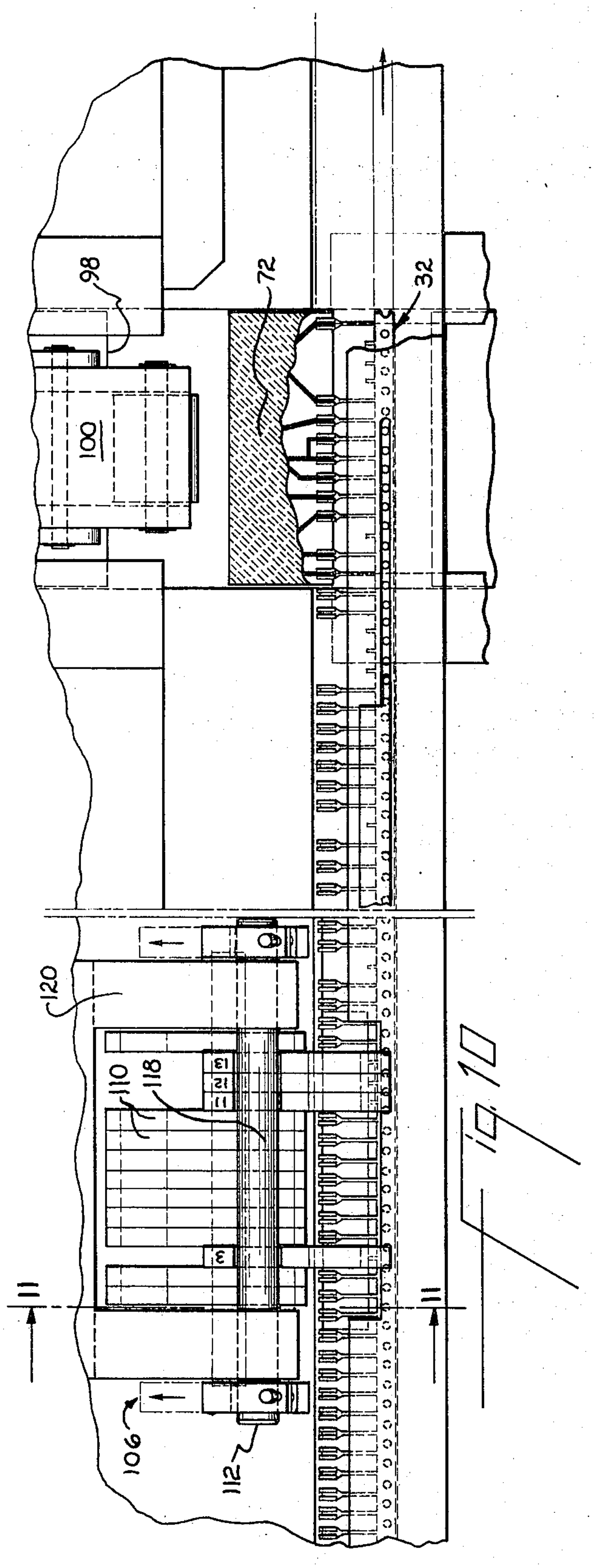
FIG. 10 is a partially broken away plan view of the loader illustrating the operation of the terminal blanking mechanism.
Figure 11:
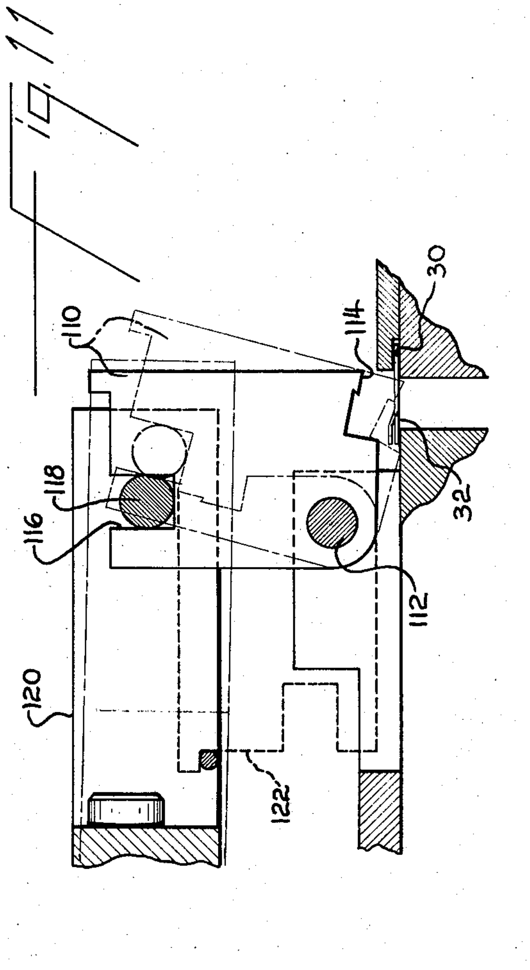
FIG. 11 is a sectional view taken along line 11—11 of FIG. 10.

When a substrate loaded with terminals by machine 10 does not require terminals at every position along its terminal receiving edge, the knives 110 located at the positions where terminals are not desired are lifted from the rest position as illustrated in heavy dotted lines 122 in FIG. 11 and pin 118 is fitted in the slots 116 of such knives. Extension of air cylinder 108 then pivots these knives in a clockwise direction as illustrated in FIG. 11 so that the cutting edges 114 are rotated into engagement with the undesired terminals and sever them from the carrier strip 30. The severing operation and subsequent loading of a number of terminals less than the total number of terminals available for loading is illustrated in FIG. 10.

Figures 2, 12:
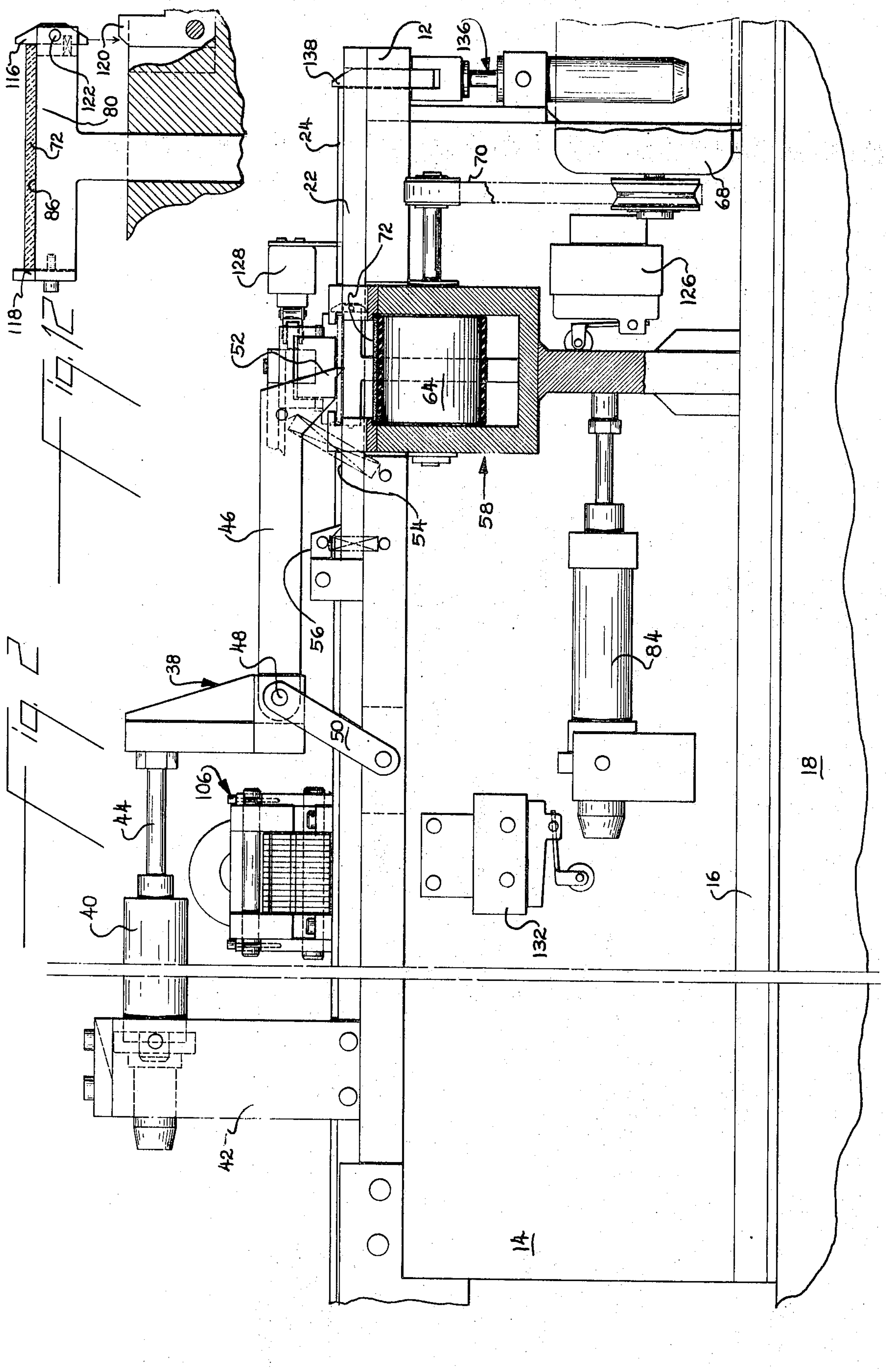
FIG. 2 is a partially broken away front elevational view of the loader of FIG. 1.
FIG. 12 is a view of the substrate elevator illustrating the substrate clamping mechanism.

FIG. 12 illustrates a substrate clamp 116 pivotally mounted on one end of elevator 80. The clamp is spring biased so that a substrate on the elevator is confined between the clamp and substrate stop 118 on the opposite end of the elevator. When the elevator is retracted in position to receive a substrate 72, the lower end of the clamp engages a cam 120. The clamp is pivoted about pin 122 and is opened by cam 120 to permit free loading of the substrate onto the surface 86 of the elevator. When the elevator is raised above the cam 120, the clamp is released and engages the substrate and holds it against the stop 118 in proper position for subsequent loading on the terminals in the work zone 104.

The operation of the substrate loader 10 will now be described in detail. The machine operates continuously, repeating a sequence of steps during loading of each individual substrate. At the start position of each cycle of operation, the elevator 80 is lowered, the pusher 92 is retracted, and the feed finger 46 is extended so that a number of clip-type terminals 32 are in the loading zone 104 in position to be attached to one side of a ceramic substrate 72. A number of these substrates have been placed on belt 60 with the lead substrate pushed on top of the lowered elevator by the frictional engagement between the upper run of the belt and the lower surface of the substrates on the belt.

The previous cycle of operation is completed by extension of feed finger 46 to position a number of terminals for loading in the work zone 104. Final extension of the feed finger brings it into engagement with the trigger of micro-switch 124 to close the micro-switch, actuate a solenoid control valve and extend the elevator air cylinder 84.

The lead substrate 72 is positioned on the top surface 86 of elevator 80, and, with extension of air cylinder 84, is raised to a position between pusher 92 and the terminals at the loading or work zone 104. Clamp 116 assures that the substrate is held against stop 118 so that the contact pads on the substrate are properly aligned with respect to the terminals. When the elevator is fully raised, the toggle linkage 82 engages the trigger of micro-switch 126 to close the same, actuate a solenoid control valve, and extend pusher air cylinder 94 so that the pusher plate 92 is moved toward the loading or work zone 104. Movement of the plate in this direction brings the spring-backed resilient roller 102 on top of the elevated substrate and holds the substrate flat against the top surface 82 of the elevator. In this way, the substrate is accurately confined both horizontally and in a direction along the lead path. Further extension of the pusher brings surface 98 into engagement with the edge of the substrate and pushes the substrate along the top of the elevator and the adjacent top surface of block 22 toward the clip portions 34 of the terminals in the work area. When the plate 92 is fully extended, the substrate has been moved sufficiently so that the edge away from the pusher plate is forced into the terminal clip portions 34 and is frictionally held on the terminals.

Completion of the extension stroke of air cylinder 94 brings toggle linkage 96 into engagement with the trigger of micro-switch 128 to close the same and actuate a number of solenoid control valves to simultaneously retract air cylinders 94, 84, and 40. Full retraction of these air cylinders closes micro-switches 130, 132, and 134. These switches are all wired in series so that when all the air cylinders are retracted and all the switches are closed another solenoid control valve is actuated to extend the feed air cylinder 40. Extension of this air cylinder moves feed finger 46 downstream along the feed path 26 to carry the substrate loaded on the terminals at the work area 104 downstream and away from the work area and also to position a new set of terminals at the work zone. Note FIG. 8.

Carrier strip cutter 136 as illustrated in FIG. 2, includes an extendable cutter 138 to sever the carrier strip 30 between adjacent loaded substrates 72. The cutter may be used to sever individual or groups of loaded substrates from strip 28.

When a substrate need not be loaded with the full number of terminals available at the work zone 104, terminal blanking or cutting device 106 may be operated to remove the undesired terminals. The blanking device is actuated at the end of each cycle of operation prior to elevation of the elevator.

After the feed finger has completed its forward movement, micro-switch 124 is again closed to actuate the first step in the next cycle of operation of the substrate loader 10. The machine continues to cycle automatically in the manner previously described.

While I have illustrated and described a preferred embodiment of my invention, it is understood that this is capable of modification, and I therefore do not wish to be limited to the precise details set forth, but desire to avail myself of such changes and alterations as fall within the purview of the following claims.

I claim:

1. A substrate loading apparatus for attaching a selected number of terminals to one side of a flat ceramic substrate or like member comprising: a terminal feed path, means for periodically moving a terminal strip along the feed path to position a number of terminals at a loading zone adjacent the feed path, first substrate feeding means for moving flat substrates laterally to a first position located to one side of the loading zone, second substrate feeding means for lifting the substrate to a second position immediately adjacent said loading zone with one edge of the substrate adjacent the terminals in the loading zone, and substrate pushing means engagable with an opposite edge of a substrate to move the substrate from said second position toward and into engagement with the terminals.

2. An apparatus as in claim 1 wherein said second means includes a substrate locating stop and means spaced along said feed path from the stop for biasing the substrate against said stop, and clamp means for holding the substrate flat in vertical alignment relative to the loading zone.

3. An apparatus as in claim 1 wherein said first substrate moving means includes a substrate loading portion on one side of said carrier strip and said first position is located on the other side of the carrier strip.

4. An apparatus as in claim 3 wherein said second substrate moving means comprises an elevator extendable from a retracted position at said first substrate loading position to said second substrate loading position adjacent said loading zone.

5. An apparatus as in claim 1 including means for selectively blanking terminals from the carrier strip confined in the lead path.

6. An apparatus for automatically loading terminals on a substrate, comprising:

reciprocating means for longitudinally feeding a carrier strip to a loading station, said carrier strip having a plurality of terminals disposed thereon at regular intervals, each terminal having a free end with a clasp disposed thereon, reciprocating means for feeding a substrate to said loading station, wherein one edge of said substrate is substantially parallel to said carrier strip and adjacent said clasps on said terminals, and reciprocating means for moving said substrate laterally toward said carrier strip and into engagement with the clasps to load the terminals thereon.

7. An apparatus according to claim 6 wherein said means for feeding said substrate comprises an elevator for receiving a substrate and raising said substrate to said loading station.

* * * * *